(12) United States Patent  
Akai et al.

(10) Patent No.: US 8,384,064 B2
(45) Date of Patent: Feb. 26, 2013

(54) ELECTROLUMINESCENT DEVICE (75) Inventors: Tomonori Akai, Nagareyama (JP); Yasuhiro Iizumi, Setagaya-Ku (JP)

(73) Assignee: Dai Nippon Printing Co., Ltd., Tokyo-To (JP)

( * ) Notice: Subject to any disclaimer, the term of this patent is extended or adjusted under 35 U.S.C. 154(b) by 200 days.

(21) Appl. No.: 12/680,418

(22) PCT Filed: Sep. 26, 2008

(86) PCT No.: PCT/JP2008/067457
§ 371 (c)(1),
(2), (4) Date: Mar. 26, 2010

(87) PCT Pub. No.: WO2009/041595
PCT Pub. Date: Apr. 2, 2009

(65) Prior Publication Data
US 2010/0237323 A1 Sep. 23, 2010

(30) Foreign Application Priority Data
Sep. 28, 2007 (JP) .................................. 2007-255603
Sep. 16, 2008 (JP) .................................. 2008-237064

(51) Int. Cl.
*H01L 33/06* (2010.01)
(52) U.S. Cl. ......... 257/14; 257/9; 257/13; 257/E33.008; 257/E31.033
(58) Field of Classification Search .................. None
See application file for complete search history.

(56) References Cited

U.S. PATENT DOCUMENTS

| | | | |
|---|---|---|---|
| 6,936,486 B2* | 8/2005 | Cheng et al. ................... 438/22 |
| 7,986,088 B2* | 7/2011 | Sekiya et al. .................. 313/501 |
| 2002/0041736 A1* | 4/2002 | LoCasclo et al. ................ 385/39 |
| 2002/0075924 A1* | 6/2002 | Mukai .............................. 372/45 |
| 2002/0110180 A1* | 8/2002 | Barney et al. ................. 374/161 |
| 2003/0042850 A1* | 3/2003 | Bertram et al. ............... 313/504 |
| 2006/0118853 A1* | 6/2006 | Takata et al. .................. 257/314 |
| 2007/0077594 A1 | 4/2007 | Hikmet et al. | |

FOREIGN PATENT DOCUMENTS

| | | |
|---|---|---|
| JP | 2005 26210 | 1/2005 |
| JP | 2005 502176 | 1/2005 |
| JP | 2005-38634 | 2/2005 |
| JP | 2006 73642 | 3/2006 |

(Continued)

OTHER PUBLICATIONS

U.S. Appl. No. 12/680,638, filed Mar. 29, 2010, Akai, et al.

(Continued)

*Primary Examiner* — Fei Fei Yeung Lopez
(74) *Attorney, Agent, or Firm* — Oblon, Spivak, McClelland, Maier & Neustadt, L.L.P.

(57) ABSTRACT

An electroluminescent device comprising a pair of electrodes, and an electroluminescent layer containing at least a luminescent layer, situated between the electrodes. The luminescent layer has a matrix material containing at least one organic compound, and quantum dots whose surfaces are protected by a protective material and that are dispersed in the matrix material. The protective material contains a first protective material. The absolute value of the ionization potential $Ip(h)$, the absolute value of the electron affinity $Ea(h)$, and the band gap $Eg(h)$ of the first protective material, the absolute value of the ionization potential $Ip(m)$, the absolute value of the electron affinity $Ea(m)$, and the band gap $Eg(m)$ of the organic compound, and the band gap $Eg(q)$ of the quantum dots fulfill all of the conditions (A) to (C): (A) $Ip(h)<Ip(m)+0.1$ eV, (B) $Ea(h)>Ea(m)-0.1$ eV, and (C) $Eg(q)<Eg(h)<Eg(m)$.

7 Claims, 2 Drawing Sheets

FOREIGN PATENT DOCUMENTS

| | | |
|---|---|---|
| JP | 2006-520077 | 8/2006 |
| JP | 2007 513478 | 5/2007 |
| WO | WO 2004/081141 A1 | 9/2004 |

OTHER PUBLICATIONS

U.S. Appl. No. 12/680,036, filed May 5, 2010, Akai, et al.

U.S. Appl. No. 12/680,046, Mar. 25, 2010, Okada, et al.

U.S. Appl. No. 12/680,439, Mar. 26, 2010, Iizumi, et al.

Seth Coe, et al., "Electroluminescence from single monolayers of nanocrystals in molecular organic devices", Nature, vol. 420, Dec. 2002, pp. 800-803.

* cited by examiner

ELECTROLUMINESCENT DEVICE

CROSS-REFERENCE TO RELATED APPLICATIONS

This application is a 371 of PCT/JP08/67457, filed Sep. 26, 2008.

This is a patent application claiming priority; the first applications are Japanese Patent Applications No. 2007-255603 filed on Sep. 28, 2007 and No. 2008-237064 filed on Sep. 16, 2008. The whole descriptions of the two earlier patent applications are incorporated herein by reference.

BACKGROUND OF THE INVENTION

1. Field of the Invention

The present invention relates to an electroluminescent device (EL device).

2. Background Art

In electroluminescent devices (EL devices), which use electroluminescence, attention is now focused on their use as light-emitting devices in various types of displays, and so forth. EL devices are self-light-emitting devices of injection luminescence type, which use luminescence that occurs at the instance electrons and holes arriving at a luminescent layer recombine with each other. The basic structure of EL devices is that a luminescent layer containing a luminescent material is situated between a cathode and an anode. EL devices are classified into inorganic ones using inorganic compounds as the luminescent material and organic ones using organic compounds as the luminescent material.

Recently, electroluminescent devices using, as the luminescent material, quantum dots have also been proposed (e.g., Japanese Laid-Open Patent Application No. 2005-38634, Published Japanese Translations No. 2005-502176 and No. 2006-520077 of PCT International Publications for Patent Applications, and Seth Coe et al., Nature 420, 800-803 (2002)). Quantum dots are nanometer-sized fine particles of a semiconductor (semiconductor nanocrystals). Owing to their quantum confinement effect (quantum size effect) with which electrons and excitons are confined in nanometer-sized small crystals, quantum dots exhibit characteristic optical and electrical properties, and their utilization is expected in a wide variety of technical fields. A quantum dot emits light having a wavelength dependent on its particle diameter, so that it is possible to obtain lights different in wavelength by controlling the particle diameter. Further, since light emitted by a quantum dot is narrow in spectral width, it is excellent in color purity.

Although a layer containing quantum dots can be formed by a wet process which dispersion of quantum dots is applied, or a dry process which a material for quantum dots is deposited to form a film by such a technique as vapor deposition or sputtering, there is a tendency to adopt a wet process from the viewpoint of simplicity of apparatus and process, smoothness of the layer formed, and so forth.

However, using a wet process to form a quantum dots-containing layer is disadvantageous in that quantum dots easily coagulate in their dispersion. For the purpose of controlling the dispersibility of quantum dots in a liquid and also the particle diameter of quantum dots in their production, the surfaces of quantum dots are protected by a protective material. Typical examples of protective materials effective in controlling the particle diameter of quantum dots in their production and in improving the dispersibility of quantum dots in a liquid include trioctylphosphine oxide (TOPO: $[CH_3(CH_2)_7]_3PO$).

Published Japanese Translation No. 2005-502176 of PCT International Publication, for example, is one of the documents that deal with techniques concerning materials for protecting quantum dots. This document describes an electroluminescent device comprising a hole-control means for injecting and transporting holes, a luminescent layer that is in contact with the hole-control means and that contains quantum dots, each dot having on its surface at least one capping molecule having a functional unit that causes injection of excitons to the quantum dot, and an electron-control means for injecting and transporting electrons to the luminescent layer, being in contact with the luminescent layer. In this document, molecules having electron-transporting, hole-transporting, or exciton-transporting parts are mentioned as the capping molecule.

In Seth Coe et al., Nature 420, 800-803 (2002), recombination of electrons and holes is caused in a monolayer of quantum dots to make the quantum dots emit light. In this technique, since the monolayer serves as a luminescent layer, the luminescent area along the film thickness is small, which limits the opportunity for recombination of electrons and holes. Moreover, since such a monolayer of quantum dots is formed by phase separation, it is disadvantageous from the viewpoint of interlaminar adhesion, driving stability, and thermal stability. Another problem is that since molecular defects caused in the monolayer lead directly to emission defects, it is difficult to control the conditions for film deposition.

Besides, protective materials, represented by TOPO, whose main purpose is to ensure the dispersibility of quantum dots are poor in charge-transport characteristics; they barely perform the function of injecting electrons and/or holes to quantum dots and hardly serve as a space where electrons and holes recombine with each other.

The aforementioned publication No. 2005-502176 describes the following two mechanisms of emission of light by an EL device. One mechanism is as follows: electrons and/or holes are transferred to the quantum dots by the electron-transporting parts and/or the hole-transporting parts of the capping molecules present on the surfaces of the quantum dots, and these charges recombine with each other in the quantum dots to emit light. Another mechanism is as follows: electrons and holes recombine with each other in the luminescent layer, that is, in a part other than the quantum dots, to produce excitons, and by the exciton-transporting parts of the capping molecules existing on the surfaces of the quantum dots, the excitons are transferred from the luminescent layer to the quantum dots to emit light.

In the EL device described in this publication No. 2005-502176, if the transferability of excitons to the capping molecules having the exciton-transporting parts is not ensured, recombination of electrons and holes in the luminescent layer may cause deterioration in luminous efficiency of the device.

SUMMARY OF THE INVENTION

The present invention was accomplished in the light of the above circumstances. An object of the present invention is to improve the mobility of excitons to quantum dots, luminescent material, thereby providing an EL device excellent in luminous efficiency.

An electroluminescent device according to the present invention comprises:
   a pair of electrodes, and
   an electroluminescent layer containing at least a luminescent layer, situated between the electrodes, the luminescent layer having a matrix material containing at least one organic compound, and quantum dots whose surfaces are protected by a protective material and that are dispersed in the matrix material, the protective material containing a first protective material, the absolute value of the ionization potential Ip(h), the absolute value of the electron affinity Ea(h), and the band gap Eg(h) of the first protective material, the absolute value of the ionization potential Ip(m), the absolute value of the electron affinity Ea(m), and the band gap Eg(m) of the organic compound, and the band gap Eg(q) of the quantum dots fulfilling all of the following conditions (A) to (C):

(A) Ip(h)<Ip(m)+0.1 eV,
(B) Ea(h)>Ea(m)−0.1 eV, and
(C) Eg(q)<Eg(h)<Eg (m).

In the EL device of the present invention, recombination of electrons and holes takes place in the protective material attached to the surfaces of the quantum dots. By thus causing production of excitons in the molecules attached to the surfaces of the quantum dots, luminescent material, it is possible to enhance the mobility of excitons to the quantum dots and improve luminous efficiency as compared with the case where excitons are produced in the quantum dots-dispersed matrix of a luminescent layer.

In the electroluminescent device according to the present invention, when the electroluminescent layer has at least one layer adjoining the luminescent layer, and if the band gap Eg(h) is smaller than the band gap Eg(a) of the material making up the layer adjoining the luminescent layer, energy is prevented from transferring from the luminescent layer to the adjoining layer, so that the quantum dots can have more improved luminous efficiency.

In the electroluminescent device according to the present invention, when the protective material has the property of transporting charges, and further contains a second protective material whose molecular weight is higher than the molecular weight of the first protective material, it is possible to ensure charge-transport characteristics for the luminescent layer while ensuring the mobility of excitons produced in the first protective material to the quantum dots.

In the electroluminescent device according to the present invention, it is preferred, for improving the charge-transport characteristics of the luminescent layer with higher certainty, that the longer chain length of the second protective material be longer than the longer chain length of the first protective material.

In the electroluminescent device according to the present invention, it is preferred that the first protective material contain, in one molecule, one or more hydrophilic group and a hydrophobic group, that the quantum dots have cores and shells surrounding the cores, and that the hydrophobic group in the first protective material, the organic compound, and the quantum dots be in at least one of the following combinations (1) to (3):

(1) the hydrophobic group in the first protective material being a residue of 3-(2-benzothiazoleyl)-7-(diethylamino)coumarin, the organic compound being 4,4'-bis(carbazol-9-yl)biphenyl, and the quantum dots being composed of the cores made of CdSe and the shells made of ZnS, having an emission wavelength of 620 nm, (2) the hydrophobic group in the first protective material being a residue of 5,6,11,12-tetraphenylnaphthacene, the organic compound being 4,4'-bis(carbazol-9-yl)biphenyl, and the quantum dots being composed of the cores made of CdSe and the shells made of ZnS, having an emission wavelength of 620 nm, (3) the hydrophobic group in the first protective material being a residue of 2,5,8,11-tetra-tert-butylperylene, the organic compound being 4,4'-bis(carbazol-9-yl)biphenyl, and the quantum dots being composed of the cores made of CdSe and the shells made of ZnS, having an emission wavelength of 520 nm.

By the present invention, it is possible to increase the mobility of excitons to quantum dots, luminescent material, thereby providing an EL device excellent in luminous efficiency.

BEST MODE FOR CARRYING OUT THE INVENTION

Figure 1:
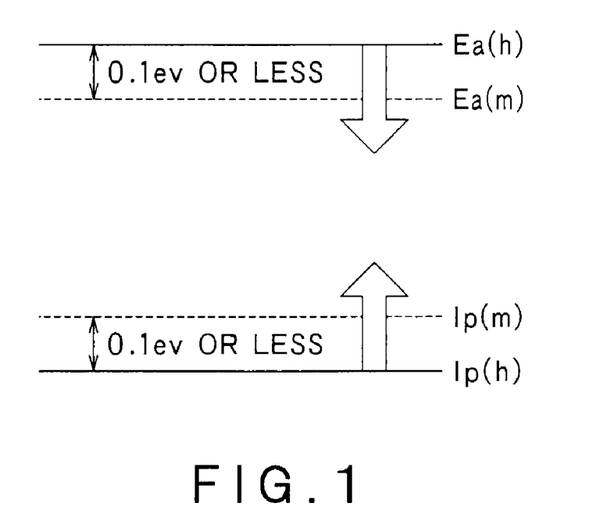
FIG. 1 is a view showing the relationship between the ionization potentials (Ip's) of the first protective material and the organic compound in the luminescent layer in the EL device according to the present invention, and the relationship between the electron affinities (Ea's) of the two.

An electroluminescent device (EL device) according to the present invention comprises a pair of electrodes, and an electroluminescent layer situated between the electrodes, containing at least a luminescent layer. The luminescent layer has a matrix material containing at least one organic compound, and quantum dots whose surfaces are protected by a protective material and that are dispersed in the matrix material. The protective material contains a first protective material. The absolute value of the ionization potential Ip(h), the absolute value of the electron affinity Ea(h), and the band gap Eg(h) of the first protective material, the absolute value of the ionization potential Ip(m), the absolute value of the electron affinity Ea(m), and the band gap Eg(m) of the organic compound, and the band gap Eg(q) of the quantum dots fulfill all of the following conditions (A) to (C): (A) Ip(h)<Ip(m)+0.1 eV, (B) Ea(h)>Ea(m)−0.1 eV, and (C) Eg(q)<Eg(h)<Eg(m) (see FIG. 1).

As far as the matrix material making up the luminescent layer contains at least one organic compound that fulfills the above-described conditions (A) to (C), it may further contain organic compounds other than the organic compound, and even inorganic compounds, etc.

The EL device of the present invention uses quantum dots as a luminescent material, and the luminescent layer has a structure that the quantum dots are dispersed in the matrix material containing at least one organic compound. In a luminescent layer composed of a matrix material in which quantum dots are dispersed, there are two possible mechanisms of emission of light by the quantum dots, luminescent material. One of them is that electrons and holes are injected into the quantum dots, and these charges recombine with each other in the quantum dots to produce excitons. Another mechanism is that excitons produced by recombination of electrons and holes at the outside of the quantum dots, e.g., in the matrix of the luminescent layer, move to the quantum dots. That is, the luminous efficiency of an EL device is greatly dependent on the mobility of electrons, of holes, and of excitons to quantum dots.

In the present invention, the first protective material that serves as a space where electrons and holes recombine with each other and that can transport excitons to the quantum dots is used as a protective material for protecting the quantum dot surfaces. The present invention can thus accelerate recombination of electrons and holes and also increase transportability, to the quantum dots, of excitons produced by recombination of the charges, thereby improving luminous efficiency.

That is, when the above relationship (C) [Eg(h)<Eg(m)] holds between the energy gap of the protective material and the energy gap of the organic compound contained in the matrix material that surrounds the quantum dots protected by the protective material, injection of charges (electrons, holes) from the matrix material to the protective material is done efficiently.

Further, when the ionization potential and the electron affinity of the protective material and those of the organic compound contained in the matrix material that surrounds the quantum dots protected by the protective material fulfill the above relationships (A) and (B) [Ip(h)<Ip(m)+0.1 eV, and Ea(h)>Ea(m)−0.1 eV] (see FIG. 1), respectively, electrons and holes can directly recombine with each other on the protective material. A protective material that fulfills the above conditions (A) and (B), that is, the energy levels of the ionization potential and the electron affinity of the organic compound contained in the matrix material are in its energy gap (see FIG. 1), has high charge-trapping ability, so that electrons and holes efficiently recombine with each other on the protective material. Even if the relationship between Ip's of the protective material and the organic compound and the relationship between Ea's of the two are theoretically Ip(h)≦Ip(m) and Ea(h)≧Ea(m), respectively, recombination of charges takes place on the protective material. In the present invention, the conditions Ip(h)<Ip(m)+0.1 eV and Ea(h)>Ea(m)−0.1 eV are set in order that charges may recombine with each other on the protective material more efficiently, and with consideration for measurement error, excitation by thermal energy (0.025 eV), and so forth.

Furthermore, when the above relationship (C) [Eg(q)<Eg(h)] holds between the energy gap of the protective material and the energy gap of the quantum dots protected by the protective material, excitons produced on the protective material can be transported to the quantum dots with high efficiency.

Recombination of electrons and holes and transfer of excitons to the quantum dots are efficiently done in the luminescent layer in the EL device according the present invention, as is mentioned above. Thus the present invention can provide an EL device excellent in luminous efficiency.

Ionization potential (Ip) can be determined by irradiating a sample with ultraviolet light and measuring the threshold excitation energy at which the sample emits photoelectrons. This measurement can be made in the air by photoelectron spectroscopy, for example.

Energy gap (Eg) can be calculated from the energies at the absorption ends of the absorption spectrum of a sample.

The electron affinity value can be obtained by subtracting the energy gap value estimated from the energies at the absorption ends of the absorption spectrum, from the ionization potential value determined by photoelectron spectroscopic measurement.

Actually, ionization potential Ip and electron affinity Ea take negative values because they are based on vacuum levels. In this specification, however, they are handled using their absolute values.

Any quantum dots can be used in the present invention, as long as they are nanometer-sized fine particles of a semiconductor (semiconductor nano-crystals) and are a luminescent material having the quantum confinement effect (quantum size effect). Specifically, semiconductor compounds of Groups II-VI, such as MgS, MgSe, MgTe, CaS, CaSe, CaTe, SrS, SrSe, SrTe, BaS, BaSe, BaTe, ZnS, ZnSe, ZnTe, CdS, CdSe, CdTe, HgS, HgSe, and HgTe; semiconductor compounds of Groups III-V, such as AlN, AlP, AlAs, AlSb, GaAs, GaP, GaN, GaSb, InN, InAs, InP, InSb, TiN, TiP, TiAs, and TiSb; semiconductor crystals containing semiconductors of Group IV such as Si, Ge, and Pb; and semiconductor compounds containing three or more elements, such as InGaP. It is also possible to use semiconductor crystals obtained by doping the above-described semiconductor compounds with rare earth or transition metal cations such as $Eu^{3+}$, $Tb^{3+}$, $Ag^{+}$, and $Cu^{+}$.

Of the above semiconductor compounds, semiconductor crystals of CdS, CdSe, CdTe, InGaP, etc. are preferred from the viewpoint of ease of preparation, control of particle diameter for emission of light in the visible range, and fluorescent quantum yield.

The quantum dot may consist of either one semiconductor compound or two or more semiconductor compounds. For example, the quantum dot may have a core-shell structure composed of a core made from a semiconductor compound and a shell made from a semiconductor compound different from the one for the core. A core-shell-type quantum dot can have increased luminous efficiency, if a semiconductor compound having a band gap greater than the band gap of a semiconductor compound for the core is used for the shell. Examples of the core-shell structure composed of semiconductor compounds having band gaps in the above relationship include CdSe/ZnS, CdSe/ZnSe, CdSe/CdS, and CdTe/CdS (core/shell).

The size of the quantum dot may be determined depending on the materials for the quantum dot so that light having the desired wavelength can be obtained. A quantum dot has a greater energy band gap when its particle diameter is smaller. Namely, as the crystal size decreases, the light that the quantum dot emits shifts to the blue side, that is, the high-energy side. It is therefore possible to control the emission wavelength over the spectral ranges of ultraviolet, visible, and infrared by changing the quantum dot size Generally, it is preferred that the particle diameters of the quantum dots be in the range of 0.5 to 20 nm, particularly in the range of 1 to 10 nm. When the size distribution of the quantum dots is smaller, clearer luminescent color can be obtained.

The quantum dot may be in any shape; it may be in the shape of a sphere, a rod, or a disc, or in other shape. When the quantum dot is non-spherical, the diameter of a sphere having the same volume as the non-spherical quantum dot is taken as the particle diameter of the non-spherical quantum dot.

Information about the particle diameter, shape, and state of dispersion of the quantum dots can be obtained with the use of a transmission electron microscope (TEM). The crystalline structure and particle diameter of the quantum dots can be known from a powder X-ray diffraction (XRD) pattern. It is also possible to obtain information about the particle diameter and surface of the quantum dots from UV-Vis absorption spectrum.

In the present invention, the quantum dots in the state of being protected by the protective material attached to their surfaces are incorporated in the luminescent layer. It is the characteristic feature of the present invention that the first protective material that fulfills all of the above conditions (A) to (C) is used as at least one of the components of the protective material.

The quantum dot surfaces being protected by the protective material means that the protective material is attached to the surfaces of the quantum dots. That the protective material is attached to the surfaces of the quantum dots include that the protective material is attached to the quantum dot surfaces by coordinate bond, and that the protective material is present on the quantum dot surfaces due to interaction (attraction force) between the quantum dot surfaces and the protective material. It is not necessary that the quantum dot surfaces be entirely covered with the protective material; the quantum dots may be exposed partially.

That the protective material is attached to the surfaces of the quantum dots can be confirmed by determining the presence of the constituent elements of the protective material with the use of X-ray photoelectron spectroscopy (XPS), one of the techniques for surface analysis.

As long as at least one first protective material that fulfills all of the above conditions (A) to (C) is attached to the surfaces of the quantum dots, two or more first protective materials may be attached to the quantum dot surfaces, or a protective material other than the first protective material may also be attached to the quantum dot surfaces.

Any material can be used as the first protective material, as long as its Ip, Ea, and Eg, those of the quantum dots protected by the protective material, and those of at least one organic compound contained in the quantum dots-dispersed matrix material of the luminescent layer fulfill the above relationships (A) to (C).

It is preferred that the band gap Eg(h) of the first protective material be smaller than the band gap Eg(a) of the constituent material of at least one layer adjoining the luminescent layer, that is, Eg(h)<Eg(a).

To meet the condition that the band gap Eg(h) is smaller than the band gap Eg(a) of the constituent material of the layer adjoining the luminescent layer, it is enough that the band gap Eg(a) of at least one material making up the layer adjoining the luminescent layer fulfills the condition Eg(h)<Eg(a); it is not necessary that all the materials making up the layer adjoining the luminescent layer fulfill the condition. Furthermore, to attain the purpose, it is enough that the above relationship holds between either one of the two layers adjoining the luminescent layer and the first protective material. The layers adjoining the luminescent layer may be any of the various constituent layers of the EL layer that will be described later.

When the above relationship Eg(h)<Eg(a) holds between the constituent material of the layer adjoining the luminescent layer and the first protective material, transfer of energy from the luminescent layer to the adjoining layer is suppressed, so that the quantum dots can have more increased luminous efficiency.

Specifically, any material can be selected for the first protective material, as long as the first protective material, the quantum dots, and the organic compound making up the matrix material fulfill the above conditions (A) to (C). For example, an organic compound having, in one molecule, one or more hydrophilic groups and a hydrophobic group can be used as the first protective material. Such an organic compound having in one molecule both hydrophilic and hydrophobic groups (hereinafter sometimes referred to as first hydrophilic-group-containing protective material) can attach to the surfaces of the quantum dots through the hydrophilic group because the hydrophilic group is compatible with the metals making up the quantum dots. The first hydrophilic-group-containing protective material is preferably an organic compound having a hydrophobic group to which a hydrophilic group is bonded at its one or both ends.

In the first hydrophilic-group-containing protective material, the hydrophilic group may be any functional group that can attach to the quantum dot surfaces. Examples of such functional groups include carboxyl group, amino group, hydroxyl group, thiol group, aldehyde group, sulfonic acid group, amide group, sulfonamide group, phosphoric acid group, phosphine group, and phosphine oxide group. It is particularly preferred that the hydrophilic group be one selected from carboxyl group, amino group, hydroxyl group, and phosphine oxide group because these groups are highly compatible with the quantum dots.

It is held that Ip, Ea, and Eg of the first hydrophilic-group-containing protective material vary depending chiefly on the hydrophobic group, which has a high molecular weight and is the main component of the first hydrophilic-group-containing protective material. It is therefore considered that by selecting a hydrophobic group having a structure that makes Ip, Ea, and Eg of the first hydrophilic-group-containing protective material fulfill the above-described conditions (A) to (C), it is possible to obtain the first protective material that fulfills the conditions (A) to (C).

Examples of such hydrophobic groups include residues of organic compounds that are used as dopants in luminescent layers in organic EL devices, and also residues of derivatives of these compounds.

Specific examples of such residues include residues of perylene derivatives, coumarin derivatives, rubrene derivatives, quinacridone derivatives, squalium derivatives, porphyrin derivatives, styryl colorants, tetracene derivatives, pyrazoline derivatives, decacyclene, phenoxazone, quinoxaline derivatives, carbazole derivatives, and fluorene derivatives. Derivatives herein include oligomers and polymers of the above-enumerated compounds.

More specifically, the above residues include residues of 2,5,8,11-tetra-tert-butylperylene (TBPe), 3-(2-benzothiazoleyl)-7-(diethylamino)coumarin [Coumarin 6], Nile Red, 1,4-bis(2,2-diphenylvinyl)benzene (DPVBi), 1,1,4,4-tetraphenyl-1,3-butadiene (TPB), and 5,6,11,12-tetraphenylnaphthacene (rubrene).

Furthermore, a residue of a phosphorescent organometallic complex having at its center an ion of such a heavy metal as white gold or platinum can also be used as the hydrophobic group. Specific examples of such residues include residues of $Ir(ppy)_3$, $(ppy)_2Ir(acac)$, $Ir(BQ)_3$, $(BQ)_2Ir(acac)$, $Ir(THP)_3$, $(THP)_2Ir(acac)$, $Ir(BO)_3$, $(BO)_2(acac)$, $Ir(BT)_3$, $(BT)_2Ir(acac)$, $Ir(BTP)_3$, $(BTP)_2Ir(acac)$, $FIr_6$, and PtOEP.

The first protective material can have any molecular weight. From the viewpoint of the mobility of excitons to the quantum dots, however, a low molecular weight is preferred for the first protective material. A low molecular weight herein means a molecular weight of 1000 or less, and a high molecular weight, a molecular weight of 10000 or more.

From the viewpoint of the mobility, to the quantum dots, of excitons produced in the first protective material, it is preferred that the longer chain length of the first protective material be 10 nm or less. This is because it is considered that excitons can move within a distance of 10 nm or less through the Förster mechanism. The longer chain length herein means the distance between two atoms furthest apart from each other in one molecule in each protective material.

To the surfaces of the quantum dots may be attached any amount of the first protective material, as long as the effect of the first protective material can be obtained. The suitable amount of the first protective material to be attached to the quantum dot surfaces varies depending on the type of the quantum dots and that of the first protective material. In the case where only the first protective material is used as the protective material for protecting the quantum dots, it is preferred that the surfaces of the quantum dots be covered with the first protective material in the state of closest packing. If the first protective material is used together with other protective materials, it is preferred that the quantum dot surfaces be covered with all the protective materials in the state of closest packing.

It is preferred that the quantum dots protected by the first protective material be further protected by a second protective material that has the property of transporting charges and a molecular weight higher than that of the first protective material. This is because if a protective material having the property of transporting charges is attached to the quantum dot surfaces, charge-transport characteristics are ensured for the luminescent layer in which the quantum dots are dispersed.

If only the quantum dots to which the first protective material is attached are present in the luminescent layer, charges such as electrons and holes are easily trapped in the first protective material, so that electrical conductivity along the film thickness of the luminescent layer is not easily ensured.

If the second protective material is introduced to the surfaces of the quantum dots together with the first protective material to increase the mobility of charges along the film thickness of the luminescent layer, charges that have failed to contribute to emission of light on the quantum dots at which they first arrived move efficiently along the film thickness to other quantum dots to contribute to emission of light, which leads to improvement in luminous efficiency. That is, by using the second protective material, it is possible to increase the electrical conductivity of the whole luminescent layer and the efficiency of the use, as emission sites, of the quantum dots dispersed in the luminescent layer.

Furthermore, by using, as the second protective material, a material having a molecular weight higher than that of the first protective material, it is possible to localize the first protective material in the vicinity of the quantum dot surfaces and the second protective material in an area apart from the quantum dot surfaces as compared with the first protective material. By so distributing the first and second protective materials on the quantum dot surfaces, it is firstly possible to transfer excitons produced in the first protective material to the quantum dots, luminescent material, efficiently, and secondly to prevent the charge transport by the second protective material from being disturbed by other protective materials including the first protective material.

The first and second protective materials can have any molecular weights, and the difference between their molecular weights may be any value, as long as the above-described effects can be obtained. The second protective material can have any molecular weight higher than that of the first protective material, and may be either a low-molecular-weight or high-molecular-weight material.

For the above-described distribution (localization) of the first and second protective materials, it is preferred that the longer chain length of the second protective material be longer than that of the first protective material. The first and second protective materials can have any longer chain lengths and the difference between the two longer chain lengths may be any value, as long as the above-described localization of the protective materials takes place. The longer chain length of the first protective material is preferably 10 nm or less, and the second protective material can have any longer chain length that is longer than the longer chain length of the first protective material.

To the surfaces of the quantum dots may be attached any amount of the second protective material, as long as the effect of the second protective material can be obtained. The suitable amount of the second protective material to be attached to the quantum dot surfaces varies depending on the type of the quantum dots and that of the second protective material. It is however preferred that the amount of the second protective material to be attached to the quantum dot surfaces be greater than that of the first protective material attached to the quantum dot surfaces (the molar percentage of the second protective material to the total of the first and second protective materials be 50% or more).

The second protective material may be any material, and examples of materials useful as the second protective material include an organic compound having, in one molecule, one or more hydrophilic groups and a hydrophobic group. Such an organic compound having in one molecule both hydrophilic and hydrophobic groups (second hydrophilic-group-containing protective material) can attach to the surfaces of the quantum dots through the hydrophilic group because the hydrophilic group is compatible with the metals making up the quantum dots. The second hydrophilic-group-containing protective material is preferably an organic compound having a hydrophobic group to which a hydrophilic group is bonded at its one or both ends.

In the second hydrophilic-group-containing protective material, the hydrophilic group may be any functional group that can attach to the quantum dot surfaces. Examples of such functional groups include carboxyl group, amino group, hydroxyl group, thiol group, aldehyde group, sulfonic acid group, amide group, sulfonamide group, phosphoric acid group, phosphine group, and phosphine oxide group. It is particularly preferred that the hydrophilic group be one selected from carboxyl group, amino group, hydroxyl group, and phosphine oxide group because these groups are highly compatible with the quantum dots.

It is held that the charge-transport characteristics of the second hydrophilic-group-containing protective material are dependent chiefly on the hydrophobic group, which has a high molecular weight and is the main component of the second hydrophilic-group-containing protective material. It is therefore considered that, by selecting a hydrophobic group having the property of transporting charges for the hydrophobic group in the second hydrophilic-group-containing protective material, it is possible to obtain the second protective material having the property of transporting charges.

Examples of such hydrophobic groups giving the property of transporting charges include residues of organic compounds that are used as electron-transporting materials in EL layers in organic EL devices, and residues of derivatives of these organic compounds.

Examples of groups having the property of transporting holes include residues of arylamine derivatives, anthracene derivatives, porphyrin derivatives, fluorene derivatives, phthalocyanine derivatives, carbazole derivatives, thiophene derivatives, distyrylbenzene derivatives, spiro compounds, and electrically conductive polymers such as polyaniline derivatives, polythiophene derivatives, and polyphenylene derivatives.

Specific examples of arylamine derivatives useful herein include bis(N-(1-naphthyl-N-phenyl)benzidine (α-NPD). Specific examples of triphenylamine derivatives include N,N'-bis-(3-methylphenyl)-N,N'-bis-(phenyl)-benzidine (TPD), copoly[3,3'-hydroxy-tetraphenylbenzidine/-diethyleneglycol]carbonate (PC-TPD-DEG), and 4,4,4-tris(3-methylphenylphenylamino)triphenylamine (MTDATA).

Specific examples of anthracene derivatives include poly[(9,9-dioctylfluorenyl-2,7-diyl)-co-(9,10-anthracene)] and 9,10-di-2-naphthylanthracene (DNA).

Specific examples of carbazole derivatives useful herein include polyvinyl carbazole (PVK), 4,4'-N,N'-dicarbazol-biphenyl (CBP), 4,4'-bis(9-carbazoyl)-2,2'-dimethyl-biphenyl (CDBP), and 4,4'-bis(carbazol-9-yl)-9,9'-dimethyl-fluorenone (DMFL-CBP). Specific examples of polythiophene derivatives include poly(3,4-ethylenedioxythiophene)-polystyrenesulfonic acid (PEDOT-PSS) and poly[(9,9-dioctylfluorenyl-2,7-diyl)-co-(bithiophene)].

Specific examples of distyrylarylene derivatives useful herein include 1,4-bis(2,2-diphenylvinyl)benzene (DPVBi).

Specific examples of fluorene derivatives include poly[(9,9-dioctylfluorenyl-2,7-diyl)-co-(4,4'-(N-(4-sec-butylphenyl))diphenylamine)] (TFB).

Specific examples of spiro compounds include poly[(9,9-dioctylfluorenyl-2,7-diyl)-alt-co-(9,9'-spiro-bifluorene-2,7-diyl)].

The above-enumerated porphyrin derivatives, arylamine derivatives, etc. may be mixed with Lewis acids, tetracyanoquinodimethane tetrafluoride (F4-TCNQ), iron chloride, inorganic oxides such as vanadium oxide and molybdenum oxide, or the like.

Examples of groups having the property of transporting electrons useful herein include residues of oxadiazoles, triazoles, phenanthrolines, silole derivatives, cyclopentadiene derivatives, and aluminum complexes. Specific examples of oxadiazole derivatives include (2-(4-biphenylyl)-5-(4-tert-butylphenyl)-1,3,4-oxadiazole (PBD). Specific examples of phenanthrolines include Bathocuproine (BCP) and Bathophenanthroline (BPhen). Specific examples of aluminum complexes include tris(8-quinolinol)aluminum complexes ($Alq_3$) and bis(2-methyl-8-quinolate)(p-phenylphenolate) aluminum complexes (BAlq).

Any process can be employed to produce the quantum dots protected by the above-described protective material. A liquid phase process which quantum dot crystals are made to grow in a liquid phase is preferred because of ease of introduction of the protective material to the quantum dot surfaces, controllability of the particle diameter of the quantum dots, simplicity of the production process, and so forth. Examples of liquid phase processes useful herein include the co-precipitation process, the reverse micelle process, and the hot soap process; the hot soap process is particularly preferred.

The hot soap process is as follows: at least one precursor of the desired quantum dots is thermally decomposed in a dispersant heated to a high temperature to cause reaction, and by this reaction, nucleation and crystal growth are made to proceed. For the purpose of regulating the rate of the reaction in the process of nucleation and crystal growth, a dispersant capable of coordinating to the constituent elements of the desired quantum dots is used as an essential component of the liquid phase medium. The hot soap process can provide quantum dots with a narrow particle diameter distribution, highly dispersible in a solution.

A method for producing the quantum dots with the use of the hot soap process will be described below in detail.

Any precursor can be used to produce the quantum dots, as long as it can form quantum dots containing the semiconductor compounds as described above. For example, to produce quantum dots containing the semiconductor compounds of Groups II-VI or III-V described above, it is possible to use compounds that can serve as the source of the constituent atoms of the semiconductor compounds, e.g., combinations of (1) inorganic or organometallic compounds containing elements of Group II and/or Group III, or metal elements of Group II and/or Group III, and (2) compounds containing elements of Group VI and/or Group V, capable of reacting with the compounds or metal elements (1) to give the semiconductor compounds; and compounds containing elements of Group II and/or Group III and those of Group VI and/or Group V.

Specific examples of the above compounds (2) include bis(trimethylsilyl)selenide [$(TMS)_2Se$]; trialkylphosphine selenides such as (tri-n-octylphosphine)selenide [TOPSe] and (tri-n-butylphosphine)-selenide [TBPSe]; trialkylphosphine tellurides such as (tri-n-octylphosphine)telluride [TOPTe] and hexapropylphosphorus triamide telluride [HPPTTe]; bis(trimethylsilyl)telluride [$(TMS)_2Te$]; bis(trimethylsilyl)sulfide [$(TMS)_2S$]; trialkylphosphinesulfides such as (tri-n-octylphosphine)sulfide [TOPS]; ammonium salts such as ammonium halides (e.g., $NH_4Cl$); tris(trimethylsilyl)phosphide [$(TMS)_3P$]; tris(trimethylsilyl)arsenide [$(TMS)_3As$]; and tris(trimethylsilyl)antimonide [$(TMS)_3Sb$].

It is preferred that the precursor of the quantum dots be soluble in a liquid phase containing the dispersant. Examples of solvents useful for the liquid phase include alkanes such as n-hexane, n-heptane, n-octane, isooctane, nonane, and decane; aromatic hydrocarbons such as benzene, toluene, xylene, and naphthalene; ethers such as diphenyl ether and di(n-octyl) ether; halogen-containing hydrocarbons such as chloroform, dichloromethane, dichloroethane, monochlorobenzene, and dichlorobenzene; amines such as n-hexylamine, n-octylamine, tri(n-hexyl)amine, and tri(n-octyl)amine; and the following compounds useful for the dispersant. Of these solvents, alkanes such as n-hexane, n-heptane, n-octane, and isooctane; trialkylphosphines such as tribuylphosphine, trihexylphosphine, and trioctylphosphine; and ethers are preferred.

Any material can be used as the dispersant, as long as it stabilizes by coordinating to fine crystals of the quantum dots in a liquid phase at a high temperature. Examples of such materials include trialkylphosphines such as tributylphosphine, trihexylphosphine, and trioctylphosphine; organophosphorus compounds such as tributylphosphine oxide, trihexylphosphine oxide, trioctylphosphine oxide (TOPO), and tridecylphosphine oxide; ω-aminoalkanes such as octylamine, decylalmine, dodecylamine, tetradecylamine, hexadecylamine, and octadecylamine; tertiary amines such as tri(n-hexyl)amine and tri(n-octyl)amine; organic nitrogen compounds such as nitrogen-containing aromatic compounds including pyridine, rutidine, collidine, and quinolines; dialkylsulfides such as dibutylsulfide; dialkylsulfoxides such as dimethylsulfoxide and dibutylsulfoxide; organic sulfur compounds such as sulfur-containing aromatic compounds including thiophene; higher fatty acids such as palmitic acid, stearic acid, and oleic acid; and 1-adamantane carboxylic acid.

Of the above-enumerated compounds, preferred for the dispersant are the following ones: compounds containing in their molecular structure nitrogen or phosphorus atom, e.g., trialkylphosphines such as tributylphosphine and trioctyi-phosphine; trialkylphosphine oxides such as tributylphos-phine oxide and trioctylphosphine oxide (TOPO); and ω-aminoalkanes having 12 or more carbon atoms, such as dodecylamine, hexadecylamine, and octadecylamine.

More preferred for the dispersant are compounds that have carbon-phosphorus single bond, such as trialkylphosphines, e.g., tributylphosphine and trioctylphosphine, and trialkylphosphine oxides, e.g., tributylphosphine oxide and trioctylphosphine oxide. Trialkylphosphine oxides such as trioctylphosphine oxide are particularly preferred.

The above dispersants can be used singly. Alternatively, a mixture of two or more dispersants selected as needed from the above-enumerated ones may be used.

The dispersant may be diluted with a suitable organic solvent (e.g., an aromatic hydrocarbon such as toluene, xylene, or naphthalene; a long-chain alkane such as octane, decane, dodecane, or octadecane; an ether such as diphenyl ether, di(n-octyl) ether, or tetrahydrofuran; or a halogen-containing hydrocarbon).

To any temperature, the liquid phase containing the dispersant may be heated, as long as the dispersant and the precursor of the quantum dots dissolve at the temperature. Although the heating temperature depends also on pressure conditions and others, it is usually set at 150° C. or more. It is preferred that the heating temperature be relatively high. The reason for this is as follows. When the heating temperature is set at high, the precursor of the quantum dots poured into the dispersant decomposes quickly, and thus a large number of cores are formed all at once. It is therefore easy to produce quantum dots relatively small in particle diameter, which makes it easy to control the particle diameter of the quantum dots.

The precursor of the quantum dots can be poured into the heated dispersant in any manner.

Any reaction temperature at which the quantum dots are produced after pouring the precursor of the quantum dots into the heated dispersant can be used, as long as the dispersant and the precursor of the quantum dots melt or dissolve in an organic solvent, and also crystal growth takes place. Although the reaction temperature varies depending also on pressure conditions and others, it is usually set at 150° C. or more.

Examples of methods for producing core-shell-type quantum dots include the following. Fine particles of a semiconductor compound that will serve as cores are first made by the hot soap process described above, and then shells are formed on the surfaces of the cores made of the fine particles of the semiconductor compound by the hot soap process.

Specifically, core-shell-type quantum dots that the core part of each dot is covered with a shell can be produced by heating a dispersant, and pouring, into the heated dispersant, fine particles of a semiconductor compound that serve as cores, and a precursor of another semiconductor compound for shells. The above-described dispersants and solvents can be used in this hot soap process as well.

The fine particles of the semiconductor, serving as the cores, and the precursor of the shells may be poured into the dispersant at one time, or the former may be poured into the dispersant earlier than the latter. It is, however, preferable to pour gradually the precursor of the shells into the dispersant after pouring the fine core particles. The reason for this is as follows. If the precursor of the shells is poured into the dispersant earlier than the fine core particles, or if a large amount of the precursor is poured into the dispersant at one time, the precursor forms cores, and thus fine particles, each particle consisting only of the material for the shell part, may be produced.

After pouring the fine core particles and the precursor of the shells into the heated dispersant, reaction for covering the cores with the shells may be carried out at any temperature, as long as the dispersant and the precursor of the shells melt or dissolve in an organic solvent, and also the crystal growth of the material for the shells takes place. Although the reaction temperature varies depending also on pressure conditions and others, it is usually 100° C. or more.

The hot soap process is usually performed in an atmosphere of an inert gas such as argon or nitrogen gas.

Generally, the quantum dots produced by the hot soap process are separated from the dispersant. Examples of techniques useful herein for separation include precipitation using centrifugation, floatation, or frothing; filtration using caking or clarification; and pressing.

The quantum dots produced in the above-described manner are in the state that part of the dispersant used in the hot soap process is attached to their surfaces. If the dispersant is equivalent to the first protective material, the quantum dots to which the dispersant is attached can be used as they are.

However, if the dispersant does not have the function of the first protective material, it is possible to obtain the quantum dots protected by the first protective material that can be used in the EL device of the present invention by replacing the dispersant with the first protective material.

Any method can be employed to replace the dispersant with first protective material. For example, a large amount of the first protective material and the quantum dots are heated while mixing them in a solvent in an atmosphere of an inert gas. In this manner, the dispersant attached to the surfaces of the quantum dots can be replaced with the first protective material existing in a large amount. Although any amount of the first protective material can be used to replace the dispersant, it is usually at least five times the weight of the quantum dots. The heating time is usually 1 to 48 hours.

Quantum dots protected by a conventional protective material such as TOPO are commercially available. It is therefore also possible to obtain the quantum dots protected by the first protective material by replacing the protective material in the commercial product with the first protective material. The above-described method of replacement can be employed to replace the conventional protective material.

To introduce the second protective material to the surfaces of the quantum dots together with the first protective material, a mixture of the first and second protective materials is used, instead of the first protective material, in the above-described method for replacing the dispersant with the first protective material. The ratio at which the first protective material and the second protective material are mixed can be selected with consideration for the compatibility of each protective material with the quantum dots, the ratio between the amounts of the first protective material and the second protective material to be attached to the quantum dot surfaces, and so forth.

Although specific examples of the components of the quantum dots and those of the components of the first protective material were given above, other materials can also be used for the quantum dots and for the first protective material. Quantum dots, a first protective material, and an organic compound to be contained in the matrix material are selected and used in combination so that they fulfill the above-described conditions (A) to (C).

The combination of quantum dots, a first protective material, and an organic compound to be contained in the matrix material is decided by selecting first quantum dots that have the desired emission wavelength, and then a first protective material and an organic compound so that the three fulfill the conditions (A) to (C).

The quantum dots protected by the above protective material are dispersed in the matrix material containing at least one organic compound that fulfills the above conditions (A) to (C). The matrix organic compound will be described later together with the other constituent materials and the composition of the luminescent layer.

Figure 2:
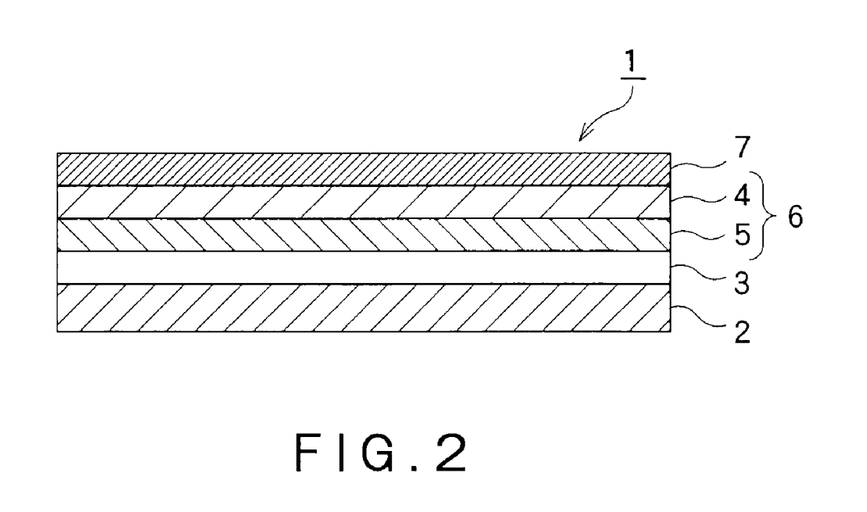
FIG. 2 is a schematic cross-sectional view showing an embodiment of the EL device according to the present invention.
Figure 3:
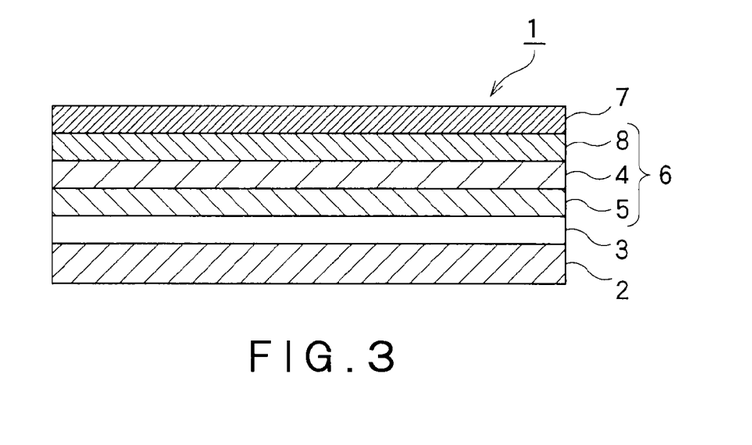
FIG. 3 is a schematic cross-sectional view showing another embodiment of the EL device according to the present invention.

Description of the quantum dots for use in the EL device of the present invention, protected by the protective material, was given above. The EL device of the present invention will now be described with reference to FIGS. 2 and 3. FIGS. 2 and 3 are schematic cross-sectional views showing embodiments of the EL device of the present invention.

In FIGS. 2 and 3, an EL device 1 has a layered structure that a first electrode 3, an EL layer 6 containing a luminescent layer 4, and a second electrode 7 that is an opposite electrode to the first electrode 3 are layered on a substrate 2 in the order named.

As will be described later, the EL layer 6 may be either a single layer consisting only of the luminescent layer 4, or a laminate of two or more layers (see FIGS. 2 and 3), as long as it contains at least the luminescent layer 4. Moreover, the EL device of the present invention may comprise layers other than the electrodes and the EL layer.

The constituent layers of the EL device of the invention will be described hereinafter.

(Substrate)

The substrate 2 supports the first electrode 3 and the other layers formed after it. In FIGS. 2 and 3, the substrate 2 supports the first electrode 3, the EL layer 6, and the second layer 7. If the EL device is of the type that the emitted light is extracted from the substrate 2 side, it is preferred that the substrate 2 be transparent. However, if the EL device is of the type that the emitted light is extracted from the second electrode 7 side, the substrate 2 need not be transparent.

Examples of transparent substrates useful herein include glass substrates made of soda-lime glass, alkali glass, lead alkali glass, borosilicate glass, aluminosilicate glass, and silica glass; and resin substrates made from resins that can be formed into films.

Preferably, resins for resin substrates have relatively high resistance to solvents and heat. Specific examples of such resins include fluororesins, polyethylene, polypropylene, polyvinyl chloride, polyvinyl fluoride, polystyrene, ABS resins, polyamide, polyacetal, polyester, polycarbonate, modified polyphenylene ethers, polysulfone, polyallylate, polyether imide, polyether sulfone, polyamide imide, polyimide, polyphenylene sulfide, liquid crystalline polyester, polyethylene terephthalate, polybutylene terephthalate, polyethylene naphthalate, polymicroyxylene dimethylene terephthalate, polyoxymethylene, polyether sulfone, polyether ether ketone, polyacrylate, acrylonitrile-styrene resins, phenol resins, urea resins, melamine resins, unsaturated polyester resins, epoxy resins, polyurethane, silicone resins, and non-crystalline polyolefins. Copolymers of the above compounds may also be used. Furthermore, a substrate having the gas-barrier properties of shielding gases such as moisture and oxygen may also be used, if necessary.

Although it is favorable to select a suitable thickness for the substrate 2 depending on the material for the substrate 2 and the intended use of the EL device to be produced, the thickness of the substrate 2 is usually about 0.005 mm to 5 mm.

Electrodes

Of a pair of the electrodes (the first electrode 3 and the second electrode 7) formed on the substrate, the electrode (the first electrode 3) formed on the substrate 2 side may be either the anode or the cathode, but it is preferably the anode. This is because, in general, an EL device can be produced stably if an anode is formed on a substrate earlier than a cathode.

Of the first and second electrodes, the electrode situated on the side from which the emitted light is extracted must be transparent. On the other hand, the electrode on the other side, opposite to the side from which the emitted light is extracted, may be either transparent or non-transparent.

It is preferred that the first electrode and the second electrode be low in electrical resistance. Although metallic materials, which are electrically conductive, are usually used for the electrodes, organic or inorganic compounds may also be used.

A conductive material whose work function is great is favorably used for the anode so that the injection of holes can be done easily. Examples of such conductive materials include metals such as alkaline metals and alkaline earth metals, e.g., Au, Ta, W, Pt, Ni, Pd, Cr, Cu, and Mo; oxides of these metals; alloys such as Al alloys, e.g., AlLi, AlCa, and AlMg, Mg alloys, e.g., MgAg, Ni alloys, Cr alloys, alkaline metal alloys, and alkaline earth metal alloys; inorganic oxides such as indium tin oxide (ITO), indium zinc oxide (IZO), zinc oxide (ZnO), and indium oxide; electrically conductive polymers, such as polythiophene, polyaniline, polyacetylene, polyalkylthiophene derivatives, and polysilane derivatives that are doped with metals; and $\alpha$-Si and $\alpha$-SiC. These electrically conductive materials may be used either singly or in combination. When two or more conductive materials are used, a laminate of layers of the materials may be used for the anode.

A conductive material whose work function is small is favorably used for the cathode so that the injection of electrons can be done easily. Examples of such conductive materials include magnesium alloys such as MgAg, aluminum alloys such as AlLi, AlCa and AlMg, and alloys of such alkaline or alkaline earth metals as Li, Cs, Ba, Sr, and Ca.

Conventional techniques for making electrodes can be used to form films of the first and second electrodes. For example, such a technique as physical vapor deposition (PVD), e.g., vacuum vapor deposition, sputtering, EB deposition, or ion plating, or chemical vapor deposition (CVD) can be used. Further, any technique for patterning can be used for patterning the first and second electrodes, as long as an electrode in the desired pattern can be precisely obtained. Specifically, photolithography, etc. can be employed.

(EL Layer)

The EL layer contains at least a luminescent layer.

Although the EL layer 6 may be composed only of the luminescent layer 4 (quantum dots-containing layer), it may also have a layered structure composed of the luminescent layer and other various layers such as a hole-injection layer, a hole-transport layer, an electron-injection layer, and an electron-transport layer so that it can exhibit improved electron- or hole-injection, or electron- or hole-transport characteristics. Each constituent layer of the EL layer may have two or more functions. Such a layer may be a hole-injection-transport layer having both the function of a hole-transport layer and that of a hole-injection layer, or an electron-injection-transport layer having both the function of an electron-transport layer and that of an electron-injection layer, for example. The function of an electron-transport layer or that of a hole-transport layer may also be given to the luminescent layer.

Other useful constituent layers of the EL layer include a carrier-block layer for preventing holes or electrons from going through the EL layer and also for preventing diffusion of excitons to trap them within the luminescent layer, thereby increasing recombination efficiency.

The EL layer can have any layered structure; the luminescent layer and the other layers may be suitably layered on top of each other. Examples of layered structures include the following: hole-transport layer 5/luminescent layer 4 (see FIG. 2), hole-transport layer 5/luminescent layer 4/electron-injection layer 8 (see FIG. 3), hole-injection layer/hole-transport layer/luminescent layer, hole-injection layer/hole-transport layer/luminescent layer/electron-transport layer, and hole-injection layer/hole-transport layer/luminescent layer/hole-blocking layer/electron-transport layer, the firstly described layer in each layered structure being on the anode side, the layers in each structure being layered in the order named.

The luminescent layer, the hole-injection layer, the hole-transport layer, the electron-transport layer, and the electron-injection layer will be described hereinafter.

(1) Luminescent Layer

The luminescent layer 4 has a structure that the quantum dots 40 protected by the protective material 45 containing at least the first protective material are dispersed in the matrix material 49 (see FIG. 2A), and has the function of providing a space where electrons and holes recombine with each other to emit light. Electrons and holes may recombine with each other at any site in the luminescent layer; the site may be not only on the first protective material but also on the quantum dots 40, or in the constituent materials (binder component, etc.) of the luminescent layer other than the quantum dots 40 and the protective material 45.

The luminescent layer may be a layer that emits light of a single color of blue, green, yellow, orange, or red, for example; a layer that emits white light, a mixture of lights of two or more colors; or a layer having luminescent patterns of the three primary colors. White light can be obtained by superposing lights emitted from two or more luminescent substances. The luminescent layer may emit white light by the superposition of lights of two colors having specified emission peak wavelengths, emitted from two different luminescent substances, or by the superposition of lights of three colors having specified emission peak wavelengths, emitted from three different luminescent substances.

Figure 2A:
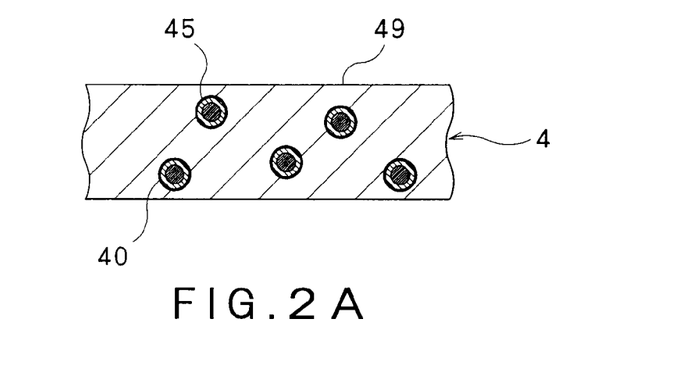
FIG. 2A is a diagrammatic view showing a matrix material, quantum dots, and a protective material in an embodiment of the EL device according to the present invention.

Description of the quantum dots 40 and that of the protective material 45 for protecting the quantum dots 40 were given above, so that they will not be repeated here.

The matrix material 49 in the luminescent layer can attain its purpose, as long as it contains at least one organic compound (matrix organic compound) that fulfills the above conditions (A) to (C). The matrix material 49 may therefore contain either only one matrix organic compound, or two or more matrix organic compounds, or can further contain other organic compounds and even inorganic compounds.

Any organic compound that fulfills the above conditions (A) to (C) can be contained in the matrix material 49. Examples of organic compounds that can be incorporated in the luminescent layer as the matrix material 49 will be given below.

Examples of the organic compound for the matrix material 49 include luminescent materials that are used as so-called host materials in luminescent layers in organic EL devices. Specific examples of such luminescent materials include the following luminescent pigment materials, luminescent metallic complex materials, and luminescent polymer materials.

Examples of luminescent pigment materials include cyclopentadiene derivatives, tetraphenylbutadiene derivatives, triphenylamine derivatives, arylamine derivatives, oxadiazole derivatives, pyrazoloquinoline derivatives, distyrylbenzene derivatives, distyrylpyridine derivatives, distyrylarylene derivatives, silole derivatives, carbazole derivatives, thiophene cyclic compounds, pyridine cyclic compounds, perinone derivatives, perylene derivatives, oligothiophene derivatives, trifumanylamine derivatives, coumarin derivatives, oxadiazole dimers, pyrazoline dimers, and phenanthrolines.

Specific examples of triphenylamine derivatives useful herein include N,N'-bis-(3-methylphenyl)-N,N'-bis-(phenyl)-benzidine (TPD) and 4,4,4-tris(3-methylphenylphenylamino)triphenylamine (MTDATA). Specific examples of arylamine derivatives useful herein include bis(N-(1-naphthyl-N-phenyl)benzidine) (α-NPD). Specific examples of oxadiazole derivatives include (2-(4-biphenylyl)-5-(4-tert-butylphenyl)-1,3,4-oxadiazole) (PBD). Specific examples of dinaphthylanthracene derivatives useful herein include 9,10-di-2-naphthylanthracene (DNA). Specific examples of carbazole derivatives useful herein include 4,4-N,N'-dicarbazole-biphenyl (CBP). Specific examples of distyrylarylene derivatives useful herein include 1,4-bis(2,2-diphenylvinyl)benzene (DPVBi). Specific examples of phenanthrolines useful herein include Bathocuproine (BCP) and Bathophenanthroline (BPhen). These materials may be used either singly or in combination.

Examples of luminescent metallic complex materials useful herein include aluminum quinolinol complexes, benzoquinolinol beryllium complexes, benzoxazole zinc complexes, benzothiazole zinc complexes, azomethyl zinc complexes, porphyrin zinc complexes, europium complexes, iridium metallic complexes, platinum metallic complexes, and metallic complexes having, as a center metal, such a metal as Al, Zn, Be, Ir or Pt, or such a rare earth metal as Tb, Eu or Dy, and, as a ligand, oxadiazole, thiadiazole, phenylpyridine, phenybenzimidazole, quinoline structure, or the like.

Specific examples of the above metallic complex materials include tris(8-quinolinol)aluminum complexes ($Alq_3$), bis(2-methyl-8-quinolate)(p-phenylphenolate)aluminum complexes (BAlq), tri(dibenzoylmethyl)-phenanthroline europium complexes, and bis(benzoquinolate)beryllium (Bebq). These materials may be used either singly or in combination.

Examples of luminescent polymer materials useful herein include polyparaphenylenevinylene derivatives, polythiophene derivatives, polyparaphenylene derivatives, polysilane derivatives, polyacetylene derivatives, polyvinylcarbazole, polyfluorenone derivatives, polyfluorene derivatives, polyquinoxaline derivatives, polydialkylfluorene derivatives, and copolymers of these derivatives. It is also possible to use materials obtained by polymerizing the above-enumerated luminescent pigment or metallic complex materials.

For the purposes of increasing luminous efficiency and changing emission wavelength, a fluorescent or phosphorescent dopant may be incorporated in the matrix material 49 of the luminescent layer together with the above-described host material. Examples of such dopants include perylene derivatives, coumarin derivatives, rubrene derivatives, quinacridone derivatives, squalium derivatives, porphyrin derivatives, styryl colorants, tetracene derivatives, pyrazoline derivatives, decacyclene, phenoxazone, quinoxaline derivatives, carbazole derivatives, and fluorene derivatives. Specific examples of these dopants include 2,5,8,11-tetra-tert-butylperylene (TBPe), Coumarin 6, Nile Red, 1,4-bis(2,2-diphenylvinyl)benzene (DPVBi), and 1,1,4,4-tetraphenyl-1,3-butadiene (TPB).

A phosphorescent organometallic complex having at its center an ion of such a heavy metal as white gold or iridium can be used as the phosphorescent dopant. Specific examples of such organometallic complexes include Ir(ppy)$_3$, (ppy)$_2$Ir(acac), Ir(BQ)$_3$, (BQ)$_2$Ir(acac), Ir(THP)$_3$, (THP)$_2$Ir(acac), Ir(BO)$_3$, (BO)$_2$(acac), Ir(BT)$_3$, (BT)$_2$Ir(acac), Ir(BTP)$_3$, (BTP)$_2$Ir(acac), FIr$_6$, and PtOEP.

Besides the above-described luminescent materials, the luminescent layer may contain, as the matrix material 49, such binder resins as polycarbonate, polystyrene, polyallylate, and polyester; and thermosetting or photo-setting resins such as epoxy resins, phenol resins, melamine resins, polyester resins, polyurethane resins, and silicone resins. The luminescent layer may also contain as the matrix material 49 other materials not described above.

The first protective material, the quantum dots 40, and the matrix organic compound that fulfill the above conditions (A) to (C) can be suitably selected as described above and used in combination. Specific examples of the combination are as follows. For example, if the first protective material has, in one molecule, one or more hydrophilic group and a hydrophobic group, the combination of the hydrophobic group in the first protective material, the organic compound, and the quantum dots 40 include the following (1) to (3) (see FIG. 2B).

Figure 2B:
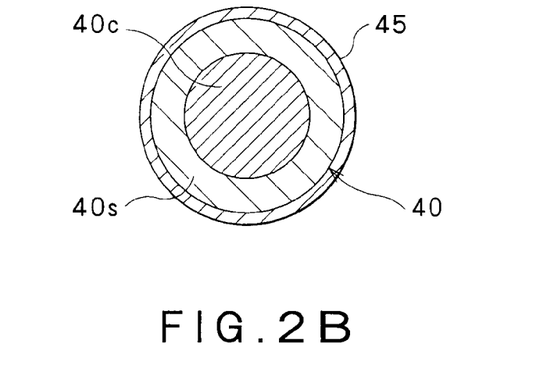
FIG. 2B is a diagrammatic view showing the inner structure of quantum dots protected by a protective material in an embodiment of the EL device according to the present invention.

(1) the hydrophobic group in the first protective material [residue of 3-(2-benzothiazoleyl)-7-(diethylamino)coumarin]/the organic compound [4,4'-bis(carbazol-9-yl)biphenyl]/the quantum dots 40 [CdSe/ZnS (core 40c/shell 40s) (emission wavelength 620 nm)], (2) the hydrophobic group in the first protective material [residue of 5,6,11,12-tetraphenylnaphthacene]/the organic compound [4,4'-bis(carbazol-9-yl)biphenyl]/the quantum dots 40 [CdSe/ZnS (core 40c/shell 40s) (emission wavelength 620 nm)], and (3) the hydrophobic group in the first protective material [residue of 2,5,8,11-tetra-tert-butylperylene]/the organic compound [4,4'-bis(carbazol-9-yl)biphenyl]/the quantum dots 40 [CdSe/ZnS (core 40c/shell 40s) (emission wavelength 520 nm)].

The luminescent layer may have any thickness, as long as it can perform its function of providing a space where electrons and holes recombine with each other to emit light. The thickness of the luminescent layer may be about 1 to 200 nm, for example.

For forming the luminescent layer, any technique can be used as long as it can provide a luminescent layer in a fine pattern required for EL devices. Examples of such techniques include vapor deposition, printing, ink-jet printing, spin coating, casting, dipping, bar coating, blade coating, roll coating, gravure coating, flexographic printing, spray coating, and self-organization (alternate adsorption, self-assembled monolayer process). Of these techniques, vapor deposition, spin coating, and ink-jet printing are preferably used herein.

Examples of vapor deposition include vacuum vapor deposition, sputtering, and ion plating. Specific examples of vacuum vapor deposition include resistance heating deposition, flash deposition, arc deposition, laser deposition, high-frequency heating deposition, and electron beam deposition.

When the luminescent layer is formed by applying a coating liquid by spin coating, ink-jet printing, or the like, any solvent can be used to prepare the coating liquid, as long as the materials for the luminescent layer can be dissolved or dispersed in it. Examples of such solvents include toluene, xylene, cyclohexanone, cyclohexanol, tetralin, mesitylene, methylene chloride, tetrahydrofuran, dichloroethane, and chloroform.

When fabricating a full- or multi-color display by the use of an EL device, it is necessary to form minute luminescent layers that emit lights different in color and to put them in a predetermined arrangement, and thus patterning luminescent layers is often needed. To obtain patterned luminescent layers different in luminescent color, a technique such as coating or deposition using a mask, or printing or ink-jet printing may be used to form each patterned luminescent layer that emits light of one color.

Walls may be present between the luminescent layers arranged. The presence of walls is advantageous in that fluorescent substances do not spread to the areas adjacent to the luminescent layers when the luminescent layers are formed by such a technique as ink-jet printing. To make the walls, a photo-curable or thermosetting resin such as a photosensitive polyimide resin or an acrylic resin, an inorganic material, or the like may be used. The material for the walls may be subjected to treatment for changing its surface energy (wettability).

(2) Hole-Injection Layer

A hole-injection layer may be formed between the anode and the luminescent layer, or between the anode and the hole-transport layer. Any hole-injecting material can be used for the hole-injection layer, as long as it can stabilize the injection of electrons into the luminescent layer. Examples of hole-injecting materials include arylamine derivatives, porphyrin derivatives, phthalocyanine derivatives, carbazole derivatives, and electrically conductive polymers such as polyaniline derivatives, polythiophene derivatives, and polyphenylene vinylene derivatives.

Specific examples of arylamine derivatives useful herein include bis(N-(1-naphthyl-N-phenyl)benzidine (α-NPD). Specific examples of triphenylamine derivatives include N,N'-bis-(3-methylphenyl)-N,N'-bis-(phenyl)-benzidine (TPD), copoly[3,3'-hydroxy-tetraphenyl-benzidine/diethyleneglycol]carbonate (PC-TPD-DEG), and 4,4,4-tris(3-methylphenylphenylamino)triphenylamine (MTDATA). Specific examples of carbazole derivatives useful herein include polyvinyl carbazole (PVK), and those of polythiophene derivatives include poly(3,4-ethylenedioxythiophene)-polystyrenesulfonic acid (PEDOT-PSS).

The above-enumerated porphyrin derivatives, arylamine derivatives, etc. may be mixed with Lewis acids, tetracyanoquinodimethane tetrafluoride (F4-TCNQ), iron chloride, inorganic oxides such as vanadium oxide and molybdenum oxide, or the like.

For the hole-injection layer, such inorganic materials as metallic oxides and carbides may also be used. Examples of inorganic materials useful herein include metallic oxides such as vanadium oxide, molybdenum oxide, ruthenium oxide, aluminum oxide, and titanium oxide; and carbides such as amorphous carbon, C60, and carbon nanotubes.

Furthermore, materials having groups capable of binding with the electrodes can be used for the hole-injection layer as well. Examples of such materials include phosphoric acid compounds, carboxylic acid compounds, sulfonic acid compounds, and silane coupling agents. Specific examples of these materials include 4-(trifluoromethyl)-benzenesulfonyl chloride, 4-chlorophenylphosphorodichloridate, and 9-fluorenylmethylchloroformate.

The hole-injection layer can have any thickness, as long as it can fully perform its function. Although such a technique as vapor deposition, printing, ink-jet printing, spin coating, casting, dipping, bar coating, blade coating, roll coating, gravure coating, flexographic printing, spray coating, or self-organization (alternate adsorption, self-assembled monolayer process) can be used to form the hole-injection layer, other techniques can be used as well. It is preferable to use vapor deposition, spin coating, or ink-jet printing.

(3) Hole-Transport Layer

A hole-transport layer may be formed between the anode and the luminescent layer, or between the hole-injection layer and the luminescent layer. Any hole-transporting material can be used for the hole-transport layer, as long as it can stabilize the transport of electrons into the luminescent layer.

Particularly, hole-transporting materials having high hole-transportability are preferred. It is also preferred that hole-transporting materials do not allow electrons moving from the cathode to go through them (electron-blocking materials). This is because by blocking electrons, it is possible to increase the efficiency of recombination of holes and electrons in the luminescent layer.

Examples of such hole-transporting materials include arylamine derivatives, anthracene derivatives, carbazole derivatives, thiophene derivatives, fluorene derivatives, distyrylbenzene derivatives, and spiro compounds.

Specific examples of arylamine derivatives useful herein include bis(N-(1-naphthyl-N-phenyl)benzidine (α-NPD). Specific examples of triphenylamine derivatives include copoly[3,3'-hydroxy-tetraphenylbenzidine/diethyleneglycol]carbonate (PC-TPD-DEG), N,N'-bis-(3-methylphenyl)-N,N'-bis-(phenyl)-benzidine (TPD), and 4,4,4-tris(3-methylphenylphenylamino)triphenylamine (MTDATA).

Specific examples of anthracene derivatives include poly[(9,9-dioctylfluorenyl-2,7-diyl)-co-(9,10-anthracene)] and 9,10-di-2-naphthylanthracene (DNA).

Specific examples of carbazole derivatives useful herein include polyvinyl carbazole (PVK), 4,4-N,N'-dicarbazole-biphenyl (CBP), and 4,4'-bis(9-carbazoyl)-2,2'-dimethyl-biphenyl (CDBP).

Specific examples of distyrylarylene derivatives useful herein include 1,4-bis(2,2-diphenylvinyl)benzene (DPVBi).

Specific examples of thiophene derivatives include poly[(9,9-dioctylfluorenyl-2,7-diyl)-co-(bithiophene)].

Specific examples of fluorene derivatives include poly[(9,9-dioctylfluorenyl-2,7-diyl)-co-(4,4'-(N-(4-sec-butylphenyl))diphenylamine)] (TFB).

Specific examples of spiro compounds include poly[(9,9-dioctylfluorenyl-2,7-diyl)-alt-co-(9,9'-spiro-bifluorene-2,7-diyl)].

The above-enumerated materials can be used either singly or in combination.

(4) Electron-Transport Layer

An electron-transport layer may be formed between the luminescent layer and the cathode, or between the luminescent layer and the electron-injection layer. Any electron-transporting material can be used for the electron-transport layer, as long as it can transport electrons injected from the cathode into the luminescent layer. Particularly, electron-transporting materials having high electron-transportability are preferred. It is also preferred that electron-transporting materials do not allow holes moving from the anode to go through them (hole-blocking materials). This is because by blocking holes, it is possible to increase the efficiency of recombination of holes and electrons in the luminescent layer.

Examples of electron-transporting materials useful herein include oxadiazoles, triazoles, phenanthrolines, silole derivatives, cyclopentadiene derivatives, and aluminum complexes. Specific examples of oxadiazole derivatives include 2-(4-biphenylyl)-5-(4-tert-butylphenyl)-1,3,4-oxadiazole (PBD). Specific examples of phenanthrolines include Bathocuproine (BCP) and Bathophenanthroline (BPhen). Specific examples of aluminum complexes include tris(8-quinolinol)aluminum complexes ($Alq_3$) and bis(2-methyl-8-quinolate)(p-phenylphenolate)aluminum complexes (BAlq).

Any thickness can be selected for the electron-transport layer, as long as the electron-transport layer can fully perform its function. A vapor deposition process can be used to form the electron-transport layer.

(5) Electron-Injection Layer

An electron-injection layer may be formed between the luminescent layer and the cathode, or between the electron-transport layer and the cathode. Any electron-injecting material can be used for the electron-injection layer, as long as it can stabilize the injection of electrons into the luminescent layer.

Examples of electron-injecting materials useful herein include alkali or alkali earth metals, oxides thereof, fluoride thereof, and organometallic complexes of alkali metals, e.g., aluminum, strontium, calcium, lithium, cesium, magnesium oxide, aluminum oxide, strontium oxide, lithium oxide, lithium fluoride, magnesium fluoride, strontium fluoride, calcium fluoride, barium fluoride, cesium fluoride, and sodium polymethacrylate polystyrenesulfonate. Of these, fluorides of alkali earth metals are preferred because they can improve organic EL layers in stability and life.

The electron-injection layer can be formed in any thickness, as long as it can fully perform its function of injecting electrons. A vapor deposition process can be used to form the electron-injection layer.

The luminescent layer, the hole-injection layer, the hole-transport layer, the electron-injection layer, and the electron-transport layer, constituent layers of the EL layer, have been described. The EL layer may have functions other than those of these layers.

EXAMPLES

Synthesis of First Protective Materials

Protective Materials for Recombination

Synthesis Example 1

A compound (formula (1)) was synthesized by adding, as the hydrophilic group, a group having phosphine oxide to the benzothiazole group in 3-(2-benzothiazolyl)-7-(diethylamino)coumarin [Coumarin 6: Ea=3.2 eV, Ip=5.5 eV, Eg=2.3 eV, molecular weight 350]. (The compound is referred to as CAP-1a.)

[Chemical Formula 1]

(1)

Formula (1)

Synthesis Example 2

A compound (formula (2)) was synthesized by adding, as the hydrophilic group, a group having phosphine oxide to the tetraphenyl group in 5,6,11,12-tetraphenylnaphthacene [rubrene: Ea=3.2 eV, Ip=5.4 eV, Eg=2.2 eV, molecular weight 533]. (The compound is referred to as CAP-1b.)

[Chemical Formula 2]

式 (2)

Formula (2)

Synthesis Example 3

A compound (formula (3)) was synthesized by adding, as the hydrophilic group, a group having phosphine oxide to the butyl group in 2,5,8,11-tetra-tert-butylperilene [TBPe: Ea=3.2 eV, Ip=5.9 eV, Eg=2.7 eV, molecular weight 488]. (The compound is referred to as CAP-1c.)

[Chemical Formula 3]

式 (3)

Formula (3)

Synthesis of Second Protective Materials

Protective Materials for Charge Transport

Synthesis Example 4

A compound (formula (4)) was synthesized by adding, as the hydrophilic group, a group having phosphine oxide to the carbazole group in 4,4'-bis(9-carbazolyl)-2,2'-dimethyl-biphenyl (CDBP: molecular weight 513). (The compound is referred to as CAP-2a.)

[Chemical Formula 4]

式 (4)

Formula (4)

Synthesis Example 5

A compound (formula (5)) was synthesized by adding, as the hydrophilic group, a group having phosphine oxide to the carbazole group in 4,4'-bis(carbazol-9-yl)-9,9'-dimethyl-fluorene (DMFL-CBP: molecular weight 525). (The compound is referred to as CAP-2b.)

[Chemical Formula 5]

式 (5)

Formula (5)

Synthesis of Protective Material

Protective Material for Recombination

Synthesis Example 6

A compound (formula (6)) was synthesized by adding, as the hydrophilic group, a group having phosphine oxide to the carbazole group in 4,4-bis(carbazol-9-yl)biphenyl (CBP: molecular weight 485). (The compound is referred to as CAP-1d.)

[Chemical Formula 6]
式 (6)

Formula (6)

Attachment of Protective Material to Quantum Dot Surfaces (Attachment of CAP-1a)

Toluene was added to CAP-1a synthesized in Synthesis Example 1. The mixture was stirred to dissolve CAP-1a in the toluene, thereby preparing a toluene solution of CAP-1a.

Subsequently, the toluene solution of CAP-1a was added dropwise, in an atmosphere of argon gas at room temperature (26° C.), to a stirred toluene in which core-shell-type quantum dots with TOPO attached to their surfaces (manufactured by evident TECHNOLOGIES, USA, core: CdSe, shell: ZnS, emission wavelength: 620 nm, Eg=about 1.9 eV) [referred to as QD1-TOPO] were dispersed. After stirring this reaction solution for 12 hours, the atmosphere was changed from argon gas to air, and toluene was added to the solution in an amount equal to that of the toluene lost by evaporation. To this solution, ethanol was added dropwise.

The precipitates were centrifugally separated from the reaction solution; they were mixed with and dispersed in toluene. To this dispersion, ethanol was added dropwise for reprecipitation to purify the precipitates.

The liquid containing the reprecipitates was subjected to centrifugal separation. In this manner, a purified product of the core-shell-type quantum dots with CAP-1a attached thereto [referred to as QD-A1] was obtained.

(Attachment of CAP-1b)

The above procedure for attaching CAP-1a was repeated, except that a toluene solution of CAP-1b was used instead of the toluene solution of CAP-1a, thereby obtaining a purified product of the core-shell-type quantum dots with CAP-1b attached thereto [referred to as QD-A2].

(Attachment of CAP-1c)

The above procedure for attaching CAP-1a was repeated, except that a toluene solution of CAP-1c was used instead of the toluene solution of CAP-1a, and that core-shell-type quantum dots with TOPO attached to their surfaces (manufactured by evident TECHNOLOGIES, USA, core: CdSe, shell: ZnS, emission wavelength: 520 nm, Eg=about 2.2 eV) [referred to as QD2-TOPO] was used instead of QD1-TOPO, thereby obtaining a purified product of the core-shell-type quantum dots with CAP-1c attached thereto [referred to as QD-A3].

(Attachment of CAP-1a and CAP-2a)

The above procedure for attaching CAP-1a was repeated, except that a toluene solution of CAP-1a and CAP-2a was used instead of the toluene solution of CAP-1a, thereby obtaining a purified product of the core-shell-type quantum dots with CAP-1a and CAP-2a attached thereto [referred to as QD-B1].

(Attachment of CAP-1a and CAP-2b)

The above procedure for attaching CAP-1a was repeated, except that a toluene solution of CAP-1a and CAP-2b was used instead of the toluene solution of CAP-1a, thereby obtaining a purified product of the core-shell-type quantum dots with CAP-1a and CAP-2b attached thereto [referred to as QD-B2].

(Attachment of CAP-1d)

The above procedure for attaching CAP-1a was repeated, except that a toluene solution of CAP-1d was used instead of the toluene solution of CAP-1a, thereby obtaining a purified product of the core-shell-type quantum dots with CAP-1d attached thereto [referred to as QD-C1].

(Attachment of CAP-1d)

The above procedure for attaching CAP-1a was repeated, except that a toluene solution of CAP-1d was used instead of the toluene solution of CAP-1a, and that QD2-TOPO was used instead of QD1-TOPO, thereby obtaining a purified product of the core-shell-type quantum dots with CAP-1d attached thereto [referred to as QD-C2].

Example 1

A thin film (thickness: 150 nm) of indium-tin oxide (ITO) was deposited on a glass substrate by sputtering to form an anode. The substrate having the anode was cleaned and was then subjected to UV ozone treatment.

Then the ITO thin film was spin-coated with a solution of polyethylene dioxythiophene-polystyrenesulfonic acid (PEDOT-PSS) in the atmosphere, and the coating film was dried to form a hole-injection layer (thickness: 20 nm).

In a glove box at a low oxygen content (oxygen content: below 0.1 ppm) and a low humidity (moisture vapor content: below 0.1 ppm), the hole-injection layer was spin-coated with a mixture prepared by mixing 4,4'-bis(carbazol-9-yl)biphenyl [CBP: Ea=3.0 eV, Ip=6.1 eV, Eg=3.1 eV] and QD-A1 with toluene, thereby forming a luminescent layer (thickness: 40 nm). CBP and QD-A1 in the above mixture were in the weight ratio of 9:1. The constituent materials and the physical properties (Ip, Ea, Eg) of the luminescent layer are shown in Table 1.

A film of bis(2-methyl-8-quinolate)(p-phenylphenolate)aluminum complex (BAlq) was deposited on the surface of the luminescent layer on the substrate in a vacuum (pressure: $5 \times 10^{-5}$ Pa) by resistance heating deposition to form a hole-blocking layer (thickness: 60 nm).

Subsequently, a film of tris(8-quinolinol)aluminum complex ($Alq_3$) (thickness: 20 nm), that of LiF (thickness: 0.5 nm), and that of Al (thickness: 150 nm) were deposited on the hole-blocking layer in the order named by resistance heating deposition to form an electron-transport layer, an electron-injection layer, and a cathode, respectively.

The above layered product was sealed with non-alkali glass in a glove box at a low oxygen content (oxygen content: below 0.1 ppm) and a low humidity (moisture vapor content: below 0.1 ppm), whereby an EL device was produced.

A voltage was applied to between the anode and the cathode in the EL device, and the luminance of the light that the EL device was emitting vertically to the plane of the substrate was measured; red luminescence originating from the quantum dots was confirmed. Further, the EL device was observed with the naked eyes; no emission defects such as dark spots were found.

Example 2

An EL device was produced in the same manner as in Example 1, except that QD-A2 was used as the quantum dots instead of QD-A1. The constituent materials and the physical properties (Ip, Ea, Eg) of the luminescent layer are shown in Table 1.

A voltage was applied to between the anode and the cathode in the EL device, and the luminance of the light that the EL device was emitting vertically to the plane of the substrate was measured; red luminescence originating from the quantum dots was confirmed. Further, the EL device was observed with the naked eyes; no emission defects such as dark spots were found.

Example 3

An EL device was produced in the same manner as in Example 1, except that QD-A3 was used as the quantum dots instead of QD-A1. The constituent materials and the physical properties (Ip, Ea, Eg) of the luminescent layer are shown in Table 1.

A voltage was applied to between the anode and the cathode in the EL device, and the luminance of the light that the EL device was emitting vertically to the plane of the substrate was measured; green luminescence originating from the quantum dots was confirmed. Further, the EL device was observed with the naked eyes; no emission defects such as dark spots were found.

Example 4

An EL device was produced in the same manner as in Example 1, except that QD-B1 was used as the quantum dots instead of QD-A1. The constituent materials and the physical properties (Ip, Ea, Eg) of the luminescent layer are shown in Table 1.

A voltage was applied to between the anode and the cathode in the EL device, and the luminance of the light that the EL device was emitting vertically to the plane of the substrate was measured; red luminescence originating from the quantum dots was confirmed. Further, the EL device was observed with the naked eyes; no emission defects such as dark spots were found.

Example 5

An EL device was produced in the same manner as in Example 1, except that QD-B2 was used as the quantum dots instead of QD-A1. The constituent materials and the physical properties (Ip, Ea, Eg) of the luminescent layer are shown in Table 1.

A voltage was applied to between the anode and the cathode in the EL device, and the luminance of the light that the EL device was emitting vertically to the plane of the substrate was measured; red luminescence originating from the quantum dots was confirmed. Further, the EL device was observed with the naked eyes; no emission defects such as dark spots were found.

Comparative Example 1

An EL device was produced in the same manner as in Example 1, except that QD1-TOPO was used as the quantum dots instead of QD-A. The constituent materials and the physical properties (Ip, Ea, Eg) of the luminescent layer are shown in Table 1.

A voltage was applied to between the anode and the cathode in the EL device, and the luminance of the light that the EL device was emitting vertically to the plane of the substrate was measured; red luminescence originating from the quantum dots was confirmed. Further, the EL device was observed with the naked eyes; no emission defects such as dark spots were found.

Comparative Example 2

An EL device was produced in the same manner as in Example 1, except that QD2-TOPO was used as the quantum dots instead of QD-A. The constituent materials and the physical properties (Ip, Ea, Eg) of the luminescent layer are shown in Table 1.

A voltage was applied to between the anode and the cathode in the EL device, and the luminance of the light that the EL device was emitting vertically to the plane of the substrate was measured; green luminescence originating from the quantum dots was confirmed. Further, the EL device was observed with the naked eyes; no emission defects such as dark spots were found.

Comparative Example 3

An EL device was produced in the same manner as in Example 1, except that QD-C1 was used instead of QD-A1 and that Coumarin 6 (3-2-(benzothiazoleyl)-7-(diethylamino)coumarin: Ea=3.2 eV, Ip=5.5 eV, Eg=2.3 eV) was used instead of CBP. The constituent materials and the physical properties (Ip, Ea, Eg) of the luminescent layer are shown in Table 1.

A voltage was applied to between the anode and the cathode in the EL device, and the luminance of the light that the EL device was emitting vertically to the plane of the substrate was measured; red luminescence originating from the quantum dots and green luminescence originating from Coumarin 6 were confirmed. Further, the EL device was observed with the naked eyes; no emission defects such as dark spots were found.

Comparative Example 4

An EL device was produced in the same manner as in Example 1, except that QD-C2 was used instead of QD-A1, and that Coumarin 6 was used instead of CBP. The constituent materials and the physical properties (Ip, Ea, Eg) of the luminescent layer are shown in Table 1.

A voltage was applied to between the anode and the cathode in the EL device, and the luminance of the light that the EL device was emitting vertically to the plane of the substrate was measured; green luminescence originating from the quantum dots and green luminescence originating from Coumarin 6 were confirmed. Further, the EL device was observed with the naked eyes; no emission defects such as dark spots were found.

TABLE 1

| | constituent materials of the luminescent layer | | | Ip | Ea | Eg |
|---|---|---|---|---|---|---|
| Example 1 | quantum dots | QD1-TOPO | QD-A1 | | | 1.9 |
| | first protective material | CAP-1a | | 5.5 | 3.2 | 2.3 |
| | matrix material | CBP | | 6.1 | 3 | 3.1 |
| Example 2 | quantum dots | QD1-TOPO | QD-A2 | | | 1.9 |
| | first protective material | CAP-1b | | 5.4 | 3.2 | 2.2 |
| | matrix material | CBP | | 6.1 | 3 | 3.1 |
| Example 3 | quantum dots | QD2-TOPO | QD-A3 | | | 2.2 |
| | first protective material | CAP-1c | | 5.5 | 3.2 | 2.3 |
| | matrix material | CBP | | 6.1 | 3 | 3.1 |

TABLE 1-continued

| | | constituent materials of the luminescent layer | | Ip | Ea | Eg |
|---|---|---|---|---|---|---|
| Example 4 | quantum dots | QD1-TOPO | QD-B1 | | | 1.9 |
| | first protective material | CAP-1a | | 5.5 | 3.2 | 2.3 |
| | second protective material | CAP-2a | | | | |
| | matrix material | CBP | | 6.1 | 3 | 3.1 |
| Example 5 | quantum dots | QD1-TOPO | QD-B2 | | | 1.9 |
| | first protective material | CAP-1a | | 5.5 | 3.2 | 2.3 |
| | second protective material | CAP-2b | | | | |
| | matrix material | CBP | | 6.1 | 3 | 3.1 |
| Comparative Example 1 | quantum dots | QD1-TOPO | — | | | 1.9 |
| | Protective material | TOPO | | | | |
| | matrix material | CBP | | | | |
| Comparative Example 2 | quantum dots | QD2-TOPO | — | | | 2.2 |
| | protective material | TOPO | | | | |
| | matrix material | CBP | | | | |
| Comparative Example 3 | quantum dots | QD1-TOPO | QD-C1 | | | 1.9 |
| | protective material | CAP-1d | | 6.1 | 3 | 3.1 |
| | matrix material | Coumarin 6 | | 5.5 | 3.2 | 2.3 |
| Comparative Example 4 | quantum dots | QD2-TOPO | QD-C2 | | | 2.2 |
| | protective material | CAP-1d | | 6.1 | 3 | 3.1 |
| | matrix material | Coumarin 6 | | 5.5 | 3.2 | 2.3 |

Evaluation of Luminous Efficiency

The EL devices of Examples 1 to 5 and those of Comparative Examples 1 to 4 were subjected to the measurement of current efficiency and voltage at a luminance of 100 cd/m².

The EL devices of Examples 1 and 2 were higher than that of Comparative Example 1 in current efficiency at a luminance of 100 cd/m². The reason for this is as follows: in the EL devices of Examples 1 and 2, recombination of charges was accelerated by the first protective material (protective material for recombination) in the luminescent layer, and the excitons produced in the first protective material were efficiently transferred to the quantum dots.

Comparison was also made between the EL device of Example 3 and that of Comparative Example 2. The former showed higher current efficiency than the latter at a luminance of 100 cd/m². This is because, in the EL device of Example 3, recombination of charges was accelerated by the first protective material (protective material for recombination) in the luminescent layer, and the excitons produced in the first protective material were efficiently transferred to the quantum dots.

As for the EL devices of Comparative Examples 3 and 4 that do not fulfill all of the conditions (A), (B), and (C) of the present invention, not only luminescence originating from the quantum dots but also luminescence originating from the protective material were observed as described above. It was therefore impossible to evaluate the life characteristics of the quantum dots.

The EL devices of Examples 4 and 5, containing the quantum dots protected by both the first protective material and the second protective material, were lower than that of Example 1, containing the quantum dots protected only by the first protective material, in voltage that makes the luminance 100 cd/m². This is because the second protective material (protective material for charge transport, CAP-2a or CAP-2b) can transport charges without being disturbed by the first protective material (protective material for recombination). Consequently, as compared with the EL device of Example 1, those of Examples 4 and 5 are lower in drive voltage and emit light with higher power efficiency.

The invention claimed is:
1. An electroluminescent device comprising:
a pair of electrodes, and
an electroluminescent layer comprising at least a luminescent layer, situated between the electrodes,
the luminescent layer comprising a matrix material comprising at least one organic compound, and quantum dots whose surfaces are protected by a protective material and that are dispersed in the matrix material, wherein
the quantum dots have cores and shells surrounding the cores,
the protective material comprises a first protective material, and
the absolute value of the ionization potential Ip(h), the absolute value of the electron affinity Ea(h), and the band gap Eg(h) of the first protective material, the absolute value of the ionization potential Ip(m), the absolute value of the electron affinity Ea(m), and the band gap Eg(m) of the organic compound, and the band gap Eg(q) of the quantum dots fulfill all of the following conditions (A) to (C):
(A) $Ip(h) < Ip(m) + 0.1$ eV,
(B) $Ea(h) > Ea(m) - 0.1$ eV, and
(C) $Eg(q) < Eg(h) < Eg(m)$
wherein
the first protective material comprises in one molecule, one or more hydrophilic group and one or more hydrophobic group,
the hydrophobic group in the first protective material, the organic compound, and the quantum dots are in at least one of the following combinations (1) to (3):
(1) the hydrophobic group in the first protective material being a residue of 3-(2-benzothiazoleyl)-7-(diethylamino)coumarin,
the organic compound being 4,4'-bis(carbazol-9-yl)biphenyl, and
the quantum dots being composed of the cores made of CdSe and the shells made of ZnS, having an emission wavelength of 620 nm,
(2) the hydrophobic group in the first protective material being a residue of 5,6,11,12-tetraphenylnaphthacene,
the organic compound being 4,4'-bis(carbazol-9-yl)biphenyl,
and
the quantum dots being composed of the cores made of CdSe and the shells made of ZnS, having an emission wavelength of 620 nm,
(3) the hydrophobic group in the first protective material being a residue of 2,5,8,11-tetra-tert-butylperylene,
the organic compound being 4,4'-bis(carbazol-9-yl)biphenyl,
and
the quantum dots being composed of the cores made of CdSe and the shells made of ZnS, having an emission wavelength of 520 nm.
2. The electroluminescent device according to claim 1, wherein the electroluminescent layer further comprises at least one layer adjoining the luminescent layer, and
the band gap Eg(h) is smaller than the band gap Eg(a) of the material making up the layer adjoining the luminescent layer.

3. The electroluminescent device according to claim 1, wherein the hydrophobic group in the first protective material, the organic compound, and the quantum dots are in combination (1).

4. The electroluminescent device according to claim 1, wherein the hydrophobic group in the first protective material, the organic compound, and the quantum dots are in combination (2).

5. The electroluminescent device according to claim 1, wherein the hydrophobic group in the first protective material, the organic compound, and the quantum dots are in combination (3).

6. The electroluminescent device according to claim 1, wherein the protective material has the property of transporting charges and further comprises a second protective material whose molecular weight is higher than the molecular weight of the first protective material.

7. The electroluminescent device according to claim 6, wherein the second protective material has a longer chain length than the chain length of the first protective material.

* * * * *